(12) United States Patent
Ni et al.

(10) Patent No.: US 6,897,156 B2
(45) Date of Patent: May 24, 2005

(54) VACUUM PLASMA PROCESSOR METHOD

(75) Inventors: Tuqiang Ni, Fremont, CA (US); Kenji Takeshita, Fremont, CA (US); Tom Choi, San Jose, CA (US); Frank Y. Lin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/347,363

(22) Filed: Jan. 21, 2003

(65) Prior Publication Data

US 2003/0106645 A1 Jun. 12, 2003

Related U.S. Application Data

(62) Division of application No. 09/607,326, filed on Jun. 30, 2000, now Pat. No. 6,531,029.

(51) Int. Cl.[7] .............................................. H01L 21/302
(52) U.S. Cl. ........................ 438/706; 438/707; 438/710; 438/712; 438/714; 438/729
(58) Field of Search ................................. 438/706, 707, 438/710, 712, 714, 729

(56) References Cited

U.S. PATENT DOCUMENTS

| | | | |
|---|---|---|---|
| 4,948,458 A | | 8/1990 | Ogle |
| 5,401,350 A | | 3/1995 | Patrick et al. |
| 5,759,280 A | | 6/1998 | Holland et al. |
| 5,800,619 A | | 9/1998 | Holland et al. |
| 5,838,111 A | | 11/1998 | Hayashi et al. |
| 5,919,382 A | | 7/1999 | Qian et al. |
| 5,975,013 A | | 11/1999 | Holland et al. |
| 6,028,285 A | * | 2/2000 | Khater et al. .......... 219/121.43 |
| 6,077,385 A | | 6/2000 | Kimura et al. |
| 6,143,144 A | * | 11/2000 | Golovato et al. ...... 204/192.33 |
| 6,164,241 A | | 12/2000 | Chen et al. |
| 6,251,241 B1 | | 6/2001 | Shin et al. |
| 6,268,700 B1 | | 7/2001 | Holland et al. |
| 6,319,355 B1 | | 11/2001 | Holland |

FOREIGN PATENT DOCUMENTS

| | | |
|---|---|---|
| EP | 0813227 A2 | 12/1997 |
| JP | 10321399 | 4/1998 |

OTHER PUBLICATIONS

Patent Abstracts of Japan, vol. 1999, No. 03, Mar. 31, 1999 and JP 10 321399A (Matsushita Electric Ind Co Ltd), Dec. 4, 1998 abstract.

Munsat T. et al, "Two New Planar Coil Designs for a High Pressure Radio Frequency Plasma Source," Applied Physics Letters, American Institute of Physics. New York, US, vol. 66, No. 17 Apr. 24, 1995, pp. 2180–2182.

* cited by examiner

Primary Examiner—Nadine G. Norton
Assistant Examiner—Binh X. Tran
(74) Attorney, Agent, or Firm—Lowe, Hauptman & Berner, LLP

(57) ABSTRACT

200 mm and 300 mm wafers are processed in vacuum plasma processing chambers that are the same or have the same geometry. Substantially planar excitation coils having different geometries for the wafers of different sizes excite ionizable gas in the chamber to a plasma by supplying electromagnetic fields to the plasma through a dielectric window at the top of the chamber. Both coils include plural symmetrical, substantially circular turns coaxial with a center point of the coil and at least one turn that is asymmetrical with respect to the coil center point. Both coils include four turns, with r.f. excitation being applied to the turn that is closest to the coil center point. The turn that is third farthest from the center point is asymmetric in the coil used for 200 mm wafers. The two turns closest to the coil center point are asymmetric in the coil used for 300 mm wafers.

24 Claims, 5 Drawing Sheets

VACUUM PLASMA PROCESSOR METHOD

This application is a divisional of application Ser. No. 09/607,326 filed on Jun. 30, 2000, now U.S. Pat. No. 6,531,029.

FIELD OF INVENTION

The present invention relates generally to a method of plasma processing workpieces having different peripheral lengths and, more particularly, to a method wherein the same chamber or chambers having the same geometry are coupled to r.f. excitation coils having differing peripheral dimensions when workpieces having differing peripheral lengths are being processed.

BACKGROUND ART

One type of processor for treating workpieces with an r.f. plasma in a vacuum chamber includes a coil responsive to an r.f. source. The coil responds to the r.f. source to produce magnetic and electric fields that excite ionizable gas in the chamber to a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458, discloses a multi-turn spiral coil for achieving the above results. The spiral, which is generally of the Archimedes type, extends radially and circumferentially between its interior and exterior terminals connected to the r.f. source via an impedance matching network. Coils of this general type produce oscillating r.f. fields having magnetic and capacitive field components that propagate through the dielectric window to heat electrons in the gas in a portion of the plasma in the chamber close to the window. The oscillating r.f. fields induce in the plasma currents that heat electrons in the plasma. The spatial distribution of the magnetic field in the plasma portion close to the window is a function of the sum of individual magnetic field components produced by each turn of the coil. The magnetic field component produced by each of the turns is a function of the magnitude of r.f. current in each turn which differs for different turns because of transmission line effects of the coil at the frequency of the r.f. source.

For spiral designs as disclosed by and based on the Ogle '458 patent, the r.f. currents in the spiral coil are distributed to produce a toroidal shaped magnetic field region in the portion of the plasma close to the window, which is where power is absorbed by the gas to excite the gas to a plasma. At low pressures, in the 1.0 to 10 mTorr range, diffusion of the plasma from the ring shaped region produces plasma density peaks just above the workpiece in central and peripheral portions of the chamber, so the peak densities of the ions and electrons which process the workpiece are in proximity to the workpiece center line and workpiece periphery. At intermediate pressure ranges, in the 10 to 100 mTorr range, gas phase collisions of electrons, ions, and neutrons in the plasma prevent substantial diffusion of the plasma charged particles outside of the toroidal region. As a result, there is a relatively high plasma flux in a ring like region of the workpiece but low plasma fluxes in the center and peripheral workpiece portions.

These differing operating conditions result in substantially large plasma flux (i.e., plasma density) variations between the ring and the volumes inside and outside of the ring, resulting in a substantial standard deviation of the plasma flux incident on the workpiece. A measure of plasma flux incident on the workpiece is etch rate of the workpiece in Angstroms per minute; the standard deviation of etch rate uniformity of an Ogle type coil is typically more than 3.0%. The substantial standard deviation of the plasma flux incident on the workpiece has a tendency to cause non-uniform workpiece processing, i.e, different portions of the workpiece are etched to different extents and/or have different amounts of molecules deposited on them.

Many coils have been designed to improve the uniformity of the plasma. The commonly assigned U.S. Pat. No. 5,759,280, Holland et al., issued Jun. 2, 1998, discloses a coil which, in the commercial embodiment, has a diameter of 12" and is operated in conjunction with a vacuum chamber having a 14.0 inch inner wall circular diameter. The coil applies magnetic and electric fields to the chamber interior via a quartz window having a 14.7 inch diameter and 0.8 inch uniform thickness. Circular semiconductor wafer workpieces having a 200 mm diameter are positioned on a workpiece holder about 4.7" below a bottom face of the window so the center of each workpiece is coincident with a center line of the coil.

The coil of the '280 patent produces considerably smaller plasma flux variations across the workpiece than the coil of the '458 patent. The standard deviation of etch rate uniformity resulting from the plasma flux produced by the coil of the '280 patent on a 200 mm wafer in such a chamber operating at 5 milliTorr is about 2.0%, a considerable improvement over the standard deviation of approximately 3.0% for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

With the advent of circular semiconductor wafers having 300 mm diameters, it has been proposed that the same vacuum chambers be used for plasma processing of circular semiconductor wafers having 200 mm and 300 mm diameters. FIG. 1 is a drawing of a processor that can be used for processing wafers having both diameters. Processors of the type illustrated in FIG. 1 are such that the same processor can be used at different times for both diameters or processors having chambers with the same geometries can be used for separately processing wafers having 200 mm and 300 mm diameters.

The vacuum plasma workpiece processor of FIG. 1 includes vacuum chamber 10, shaped as a cylinder including grounded metal wall 12 having an interior diameter of 20", metal base plate 14, and circular top plate structure 18, consisting of a dielectric window structure 19, having the same thickness from its center to its periphery and a diameter exceeding the inner diameter of chamber 10 so the window bears against the top edge of wall 12. Sealing of vacuum chamber 10 is provided by conventional gaskets (not shown). The processor of FIG. 1 is typically used for etching a circular semiconductor wafer (i.e., a substrate) or for depositing molecules on such a wafer.

A suitable ionizable gas that can be excited to a plasma state is supplied to the interior of chamber 10 from a gas source (not shown) via port 20 in window 19. The interior of chamber 10 is maintained in a vacuum condition, at a pressure that can vary in the range of 1–100 milliTorr, by a vacuum pump (not shown), connected to port 22 in base plate 14.

The gas in the chamber is excited by a suitable electric source to provide a plasma having a density that is considerably more uniform than the plasma excited by the coil disclosed in the Ogle '458 patent. The electric source includes a substantially planar metal coil 24 having a square cross-section and a hollow interior; coil 24 is typically made of square copper tubing. Coil 24 is mounted immediately above window 19 and excited by r.f. power source 26, typically having a fixed frequency of 13.56 MHz and usually having a fixed amplitude envelope. The current in coil 24 generates a large enough magnetic field flux in chamber 10 in proximity to window 19 to excite ionizable gas in the chamber to a plasma.

Impedance matching network 28, connected between output terminals of r.f. source 26 and excitation terminals of coil 24, couples the output of the r.f. source to the coil. Impedance matching network 28 includes variable reactances (not shown) which a controller (not shown) varies in a known manner to achieve impedance matching between source 26 and a load including coil 24 and the plasma load the coil drives.

Circular workpiece 32, which can have a 200 mm or 300 mm diameter, is fixedly mounted in chamber 10 to a surface of circular workpiece holder (i.e., chuck or platen) 30; the surface of chuck 30 carrying workpiece 32 is parallel to the surface of window 19. Chuck 30, typically of the electrostatic type, has one of two differing diameters, depending on the diameter of the workpiece being processed at a particular time in chamber 10. Workpiece 32 is usually electrostatically clamped to the surface of chuck 30 by applying a DC potential of a DC power supply (not shown) to one or more electrodes (not shown) of the chuck.

R.f. source 31 supplies an r.f. voltage having a constant amplitude envelope to impedance matching network 33, that includes variable reactances (not shown). Matching network 33 couples the output of source 31 to an electrode of chuck 30. A controller (not shown) controls the variable reactances of matching network 33 to match the impedance of source 31 to the load impedance coupled to the electrode of chuck 30. The load coupled to the electrode is primarily the plasma in chamber 10. As is well known, the r.f. voltage that source 31 applies to the electrode of chuck 30 interacts with charge particles in the plasma to produce a DC bias on workpiece 32.

Surrounding planar coil 24 and extending above top end plate 18 is a metal tube or shield 34 having a square cross section within which the coil sits. Shield 34 decouples electromagnetic fields originating in coil 24 from the surrounding environment. The distance between shield 34 and the peripheral regions of coil 24 is large enough to prevent significant absorption by shield 34 of the magnetic fields generated by the peripheral regions of coil 24.

The diameter of cylindrically shaped chamber 10 relative to the outer diameter of coil 24 is large enough to prevent substantial absorption by chamber walls 12 of the magnetic fields generated by the peripheral regions of the coil. The diameter of dielectric window structure 19 is greater than the inner diameter of chamber 10 to such an extent that the entire upper surface of chamber 10 consists of dielectric window structure 19.

The distance between the treated surface of workpiece 32 and the bottom surface of dielectric window structure 19 is chosen to provide the most uniform plasma flux on the exposed, processed surface of the workpiece. Typically, the distance between the workpiece processed surface and the bottom of the dielectric window is approximately 0.3 to 0.4 times the diameter of chamber 10; the inner diameter of chamber 12 is 20", the diameter of coil 24 having the prior art shape of the '280 patent is 13" for a 200 mm diameter wafer, shield 34 has a length of 23½" on each side, and the distance between the workpiece processed surface and the bottom of the dielectric window is 6.0".

Planar coil 24 functions as a transmission line to produce a standing wave pattern along the length of the coil. The standing wave pattern results in variations in the magnitude of the r.f. voltages and currents along the length of the coil. The dependence of the magnetic flux generated by the coil on the magnitude of these r.f. currents results in differing amounts of plasma being produced in different portions of chamber 10 beneath different portions of the coil. The transmission line behavior of the r.f. current in planar coil 24 increases the amount of magnetic flux generated by the peripheral coil segments relative to the center coil segments. This result is achieved by exciting coil 24 with r.f. so the regions of maximum r.f. current are on the peripheral coil segments.

As illustrated in FIG. 2, the planar coil 24 with the shape of the '280 patent includes interior substantially semicircular loops 40, 42 and peripheral substantially circular segments 46 and 48 and an intermediate substantially circular segment 44. Each of loops 40 and 42 forms almost a half turn of coil 24, while each of loops 44, 46 and 48 forms almost a full turn; the full and half turns are connected in series with each other. All of segments 40, 42, 44, 46 and 48 are coaxial with central coil axis 50, in turn coincident with the center axis of chamber 10 and the center of wafer 32 when the wafer is clamped in place on chuck 30. Opposite excitation terminals 52 and 54, in the center portion of coil 24, are respectively coupled by leads 48 and 56 to opposite terminals of r.f. source 26 via matching network 28 and one electrode of capacitor 80, the other electrode of which is grounded. Terminal 60, at the end of loop 40 opposite from terminal 52, is connected to end terminal 66 of outer loop segment 48 by metal strap 64 which is located in a region somewhat above the plane of coil 24. The spacing between adjacent segments 40, 42, 44, 46 and 48 and the spacing between strap 64 and the remainder of coil 24 are great enough to prevent arcing between them. The radii of the outer edges of segments 40, 42, 44, 46 and 48 are respectively 2", 2", 3.5", 5.5" and 6.5".

Segment 48 has a second terminal 68 slightly less than 360° from terminal 66; terminal 68 is connected to terminal 70 of loop segment 46 via strap 72. Loop 46, having an angular extent of almost 360°, has a second end terminal 74 connected to terminal 76 of loop 44 via radially and circumferentially extending strap 78. Loop 44, having an angular extent of almost 360°, has a second end terminal 80 which is connected by radially and circumferentially extending strap 82 to terminal 62 at the end of segment 42 opposite from terminal 54.

Capacitor 80, having a capacitive impedance $Z_{cap}=1/(j2\pi fC)$, where $j=\sqrt{-1}$, f is the frequency of r.f. source 26, and C is the capacitance of capacitor 30, shifts the phase and therefore location of the voltage and current distribution across the entire length of coil 24. The voltage and current distribution are shifted in coil 24 so the coil produces r.f. electric and magnetic fields which provide plasma flux on the processed surface of workpiece 32 that is considerably more uniform than the flux resulting from energization of a coil of the type Ogle discloses in the '498 patent.

The voltage and current of coil 24 are distributed by selecting the value of capacitor 80 so the peak-to-peak r.f. current at coil terminal 54 is a minimum and equals the peak-to-peak r.f. current at coil terminal 52. At this condition, the coil has opposite polarity maximum peak-to-peak r.f. voltages at terminals 52 and 54 and the coil maximum r.f. current occurs near conductive strap 72. The distribution of r.f. voltages and currents in the coil can be approximated by $$V_{pkpk}{}^{(X)} = V°_{pkpk} \cos[\beta(x+x°)] \text{ and}$$

$$I_{pkpk}{}^{(X)} = I°_{pkpk} \sin[\beta(x+x°)],$$

where:
- x is the linear distance measured from terminal 54 of the coil,
- β is the angular frequency of r.f. source 26 (i.e. 2πf), divided by c, the speed of light,
- x° is an offset from zero which is determined by the value of the capacitor 80, and
- $V°_{pkpk}$ and $I°_{pkpk}$ are respectively the maximum r.f. peak-to-peak voltages and currents in the coil.

The value of capacitor 80 is selected so x° is about 0.15 times the wavelength (λ=c/f) of the r.f. current flowing in the coil.

The peripheral regions of coil 24 produce greater magnetic flux than the center region of the coil because the magnitude of the peak-to peak r.f. current is greater in the peripheral segment of the coil relative to the magnitude of the peak-to-peak currents of the central segments. The maximum peak-to-peak r.f. current amplitude occurs in substantially circular loop segment 46. The amplitudes of the peak-to-peak r.f. currents in adjacent loop segments 44 and 48 and in loop segment 46 and the spacing of loop segments 44, 46 and 48 from each other are such that magnetic fluxes from these three loop segments are combined in space to provide a total magnetic flux density, just under window 19, having a maximum value over a relatively broad annular area. The annular area extends from between loop segments 46 and 48 to between intermediate segment 44 and interior segments 40 and 42.

The variations in the r.f. current magnitude flowing in different parts of the coil are spatially averaged to assist in causing a more uniform plasma to be incident on wafer 32 than is attained by the coil of the Ogle '498 patent. It was previously thought that spatially averaging these different current values in the different parts of the coil substantially prevented substantial non-radial asymmetries in the plasma density, particularly at regions of high r.f. current in the coil segments near the coil periphery. The total magnetic flux is also considerably more constant as a function of angular coordinate θ than is the case for the coil of the Ogle patent, (where θ represents the angle about the coil periphery relative to a reference angle that extends through the coil center point 50°, e.g., the reference angle extends horizontally in FIG. 2 to the left of center point 50).

A spatially averaged magnetic flux which is constant along a particular coordinate value θ provides a plasma which is more radially symmetric along θ than is the case of plasma resulting from the coil disclosed in the Ogle '458 patent. The amplitudes of the peak-to-peak r.f. currents in the two substantially semicircular, equal radius segments 40 and 42 are significantly less than the amplitudes of the currents in the other segments. Segments 40 and 42 derive sufficient magnetic fluxes which are spatially averaged with the magnetic fluxes derived from the other segments 44, 46 and 48 so the plasma flux generated at the level of the processed surface of workpiece 32 across the diameter of the chamber is considerably more uniform than is achieved with the coil of the Ogle patent.

The electrostatic (i.e., capacitive) coupling to the plasma of the voltages at different portions of planar coil 24 (for example, between portions of loop segments 46 and 48 at the same angular coordinate position θ) has an influence on the uniformity of the generated plasma flux. The capacitive coupling of these voltages to the plasma depends on the magnitude of the peak-to-peak voltages occurring in the coil segments, as well as the thickness and dielectric material of window 19 which separates the coil from the plasma. The influence of the capacitive currents produced by the r.f. voltages is minimized by causing the highest r.f. peak-to-peak voltages to occur at terminals 52 and 54. The geometry of coil 24 and proper selection of the value of capacitor 80 cause the highest r.f. peak-to-peak voltages to occur at terminals 52 and 54. R.f. excitation of planar coil 24 produces a substantially planar plasma having a flux that is considerably more uniform completely across workpiece 32 than that resulting from the coil of the Ogle '458 patent.

As the features of integrated circuits have become smaller and smaller, we have found that the uniformity of the plasma incident on a 200 mm wafer produced by the coil described in connection with FIG. 2 is frequently not sufficient. There is an asymmetric diametric plasma flux distribution on the 200 mm wafers formed with the processor of FIG. 1 when the plasma is excited by the described 13 inch diameter coil. The asymmetry is sufficient to have an adverse effect on semiconductor devices having 0.18 micrometer features formed on a 200 mm semiconductor wafer. In particular, we found that the etch rate on circular 200 mm polysilicon wafer 71 is as shown in FIG. 3 by regions 72, 74, 76, 78 and 80 when the wafer was etched at a vacuum of approximately 20 mTorr in the described processor of FIG. 1 while gas in the processor was excited to a plasma by the coil of FIG. 2 being connected to a 13.56 MHz r.f. source 26. The periphery of wafer 71 includes a positioning notch, shown in FIG. 3 as point 73. A positioning device (not shown) placed wafer 71 in chamber 10 so that the notch was offset about 10° clockwise from vertical line 75, FIG. 3, extending through wafer center point 70.

Wafer 71 center point 70 is surrounded by region 72 having a maximum etch rate of 2378 Angstroms per minute. Region 72 is somewhat asymmetrical, having a greater extent to the left of center point 70 than to the right, as illustrated in FIG. 3. Surrounding region 72 is region 74, having an etch rate between 2378 and 2396 Angstroms per minute. Region 74 extends to the left edge of wafer 71 spanning an arc length of approximately 100° along the left edge of the wafer. Region 74 also extends somewhat to the right side of region 72 and has an approximately circular peripheral contour within the wafer.

Generally crescent shaped regions 76, 78 and 80, to the right, as well as above and below center point 70 and region 74, respectively represent etch rates in the ranges of 2398–2418 Angstroms per minute, 2418–2438 Angstroms per minute and above 2438 Angstroms per minute. Region 76 has an arc length on the periphery of wafer 71 of about 30° above and about 15° below center point 70 on the periphery of the wafer; region 78 has an arc length on the periphery of wafer 71 of approximately 15° above center point 70 and about 20° below center point 70, while region 80 has an arc length of about 170° along the right edge of the wafer. In general, there is a monotonic variation of etch rate from the left edge of region 76 to the periphery of region 80 along the edge of the wafer.

Wafer 71 has an average etch rate of 2412 Angstroms per minute and a non-uniformity of 1.4% at a standard deviation of one sigma. This high degree of uniformity was frequently sufficient for processing of prior art 200 mm wafers having features greater than 0.18 micrometers, i.e., to etch materials from such wafers and to deposit materials on the wafers. However, with the advances in integrated circuitry resulting in features as small and smaller than 0.18 microns, the uniformity illustrated in FIG. 3 achieved with the coil of FIG. 2 is not always adequate.

An analysis of FIG. 3 reveals an asymmetry in plasma density associated with regions 76, 78 and 80, all of which are essentially to the right side of center point 70, as well as regions 72 and 74. We have realized that reducing the plasma density variations associated with regions 76, 78 and 80 is very likely to enable the plasma density uniformity to be increased to a greater extent than is achieved with the coil illustrated in FIG. 2.

It is accordingly an object of the invention to provide a new and improved method of operating a plasma processor such that workpieces having the same geometry but differing sizes can be processed in the same processor chamber or in chambers having the same geometry.

An added object of the invention is to provide a new and improved method of operating a plasma processor such that circular semiconductor wafers having 200 and 300 mm diameters can be processed in the same processor chamber or in chambers having the same geometry.

SUMMARY OF THE INVENTION

One aspect of the invention relates to a method of processing workpieces having differing first and second peripheral lengths and geometrically similar shapes in the same vacuum plasma processing chamber or vacuum plasma processing chambers having the same geometries. The method includes the step of causing r.f. plasma excitation coils having first and second different peripheral dimensions to be coupled to ionizable gas in the chamber or chambers while the workpieces having the first and second peripheral lengths are being respectively processed in the chamber or chambers while the chamber or chambers are in vacuo and r.f. energy is supplied to the coils to excite the gas to a processing plasma. The first peripheral length exceeds the second peripheral length, and the first peripheral dimension is greater than the second peripheral dimension.

Preferably, the workpieces are circular and each of the coils includes plural substantially circular coaxial turns having a center point aligned with center points of the circular workpieces and each of the coils includes at least one turn that is asymmetric with respect to the coil center point.

The above and still further objects, features and advantages of the present invention will become apparent upon consideration of the following detailed descriptions of several specific embodiments thereof, especially when taken in conjunction with the accompanying drawings.

BRIEF DESCRIPTION OF THE DRAWINGS

As described.

As described.

As described.

DETAILED DESCRIPTION OF FIGS. 4–8

Figure 1:
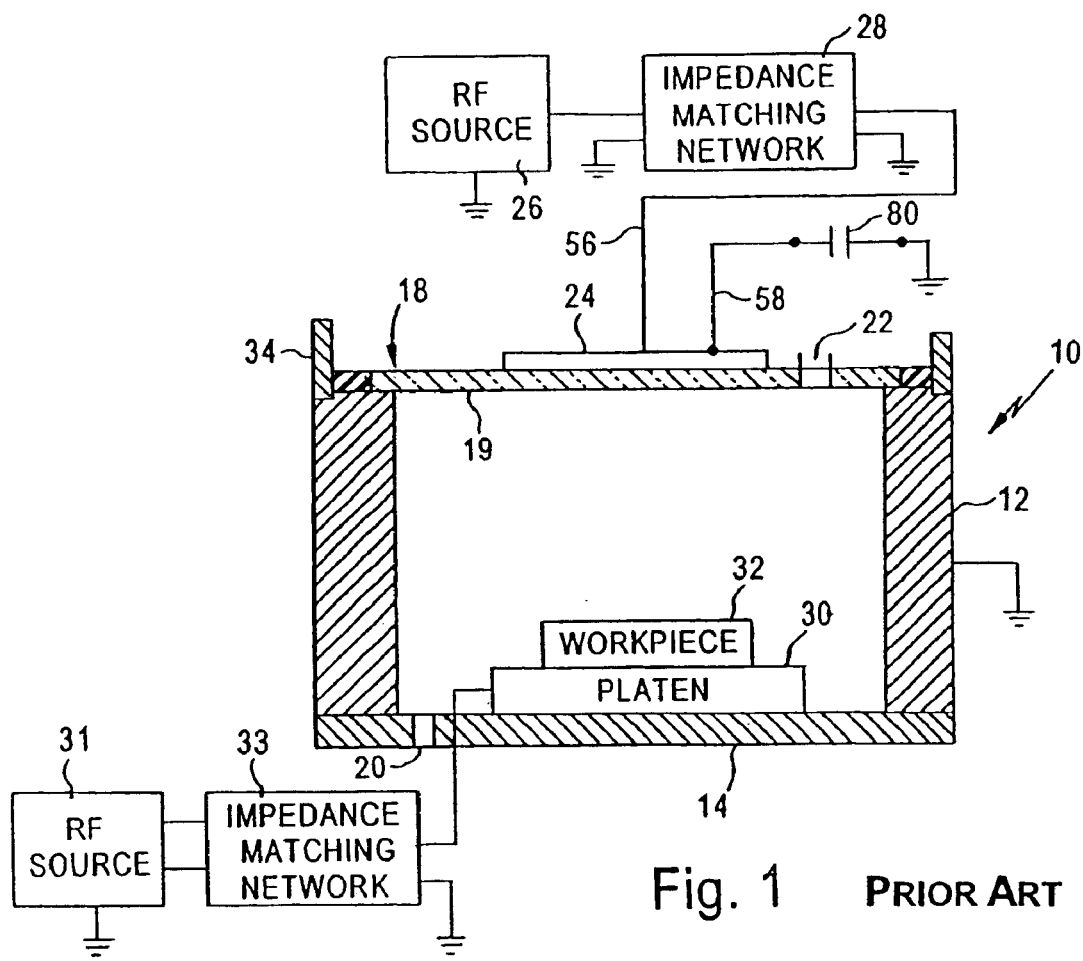
FIG. 1 is a schematic diagram of a vacuum plasma processor which is applicable to the present invention.
Figure 2:
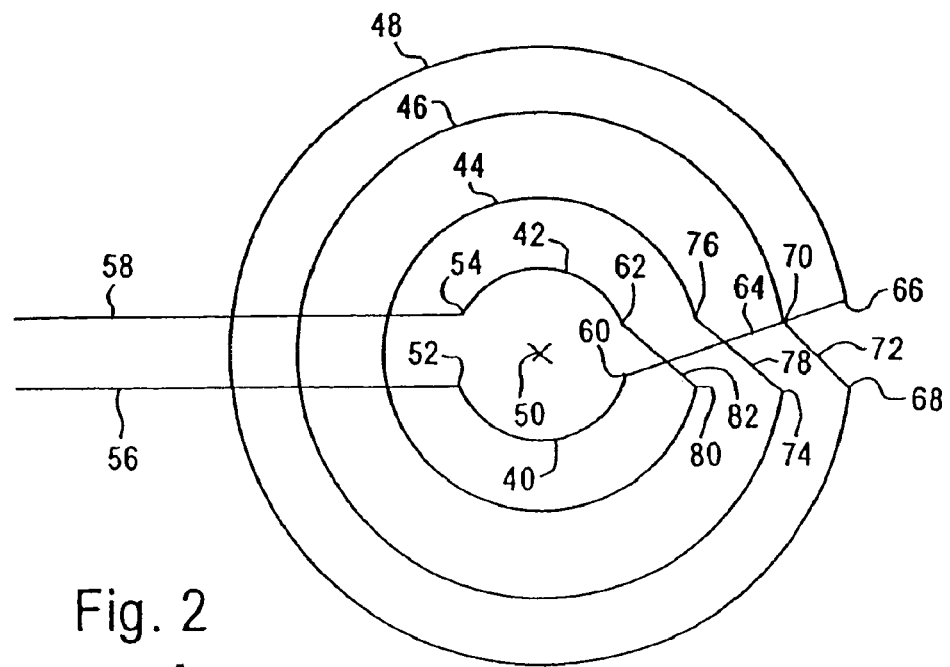
FIG. 2 is a top view of a coil having substantially the same shape as described in the previously mentioned Holland et al. patent.
Figure 4:
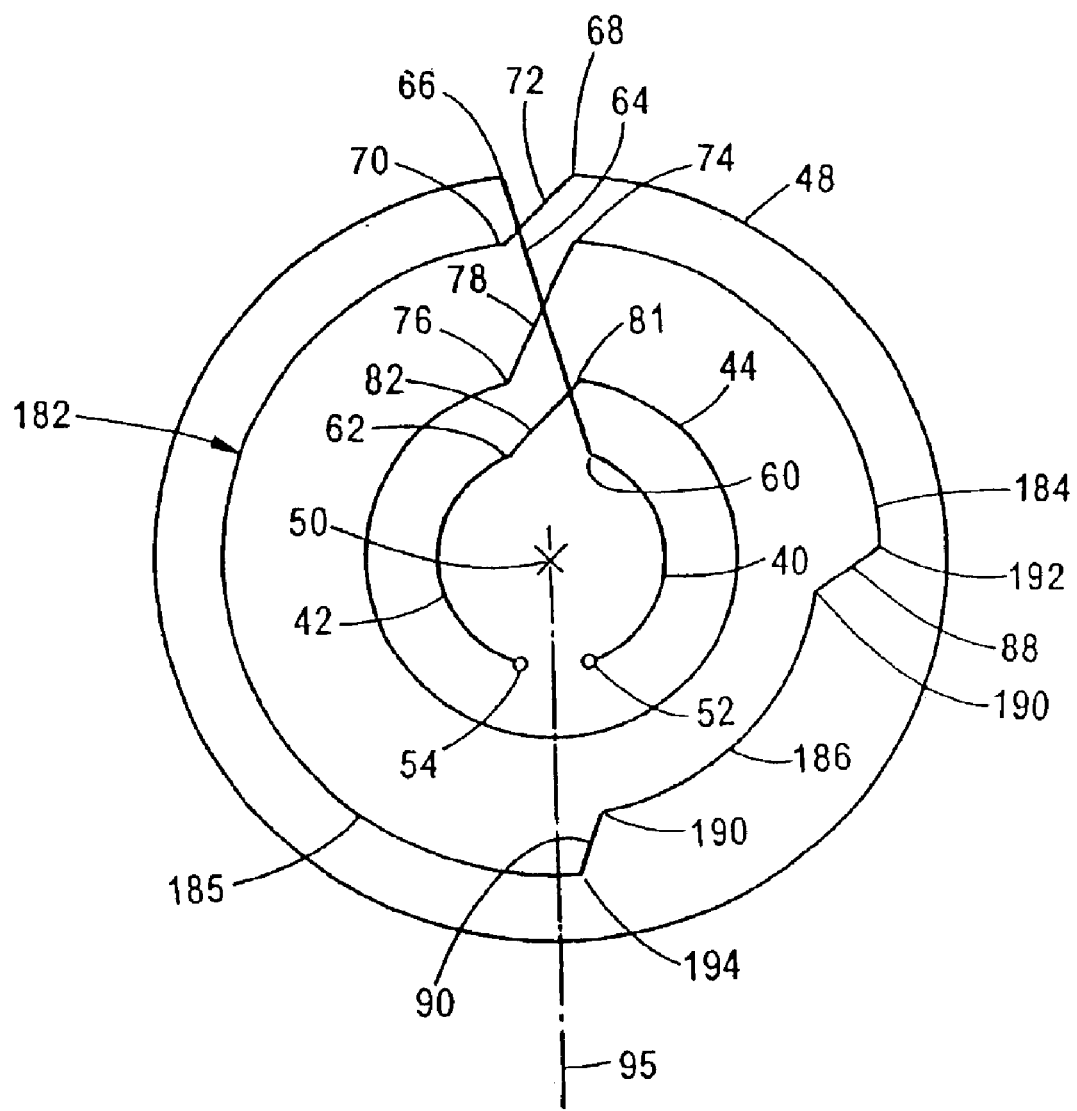
FIG. 4 is a top schematic view of a coil for use in processing a 200 mm diameter wafer in accordance with one preferred embodiment of the present invention.
Figure 5:
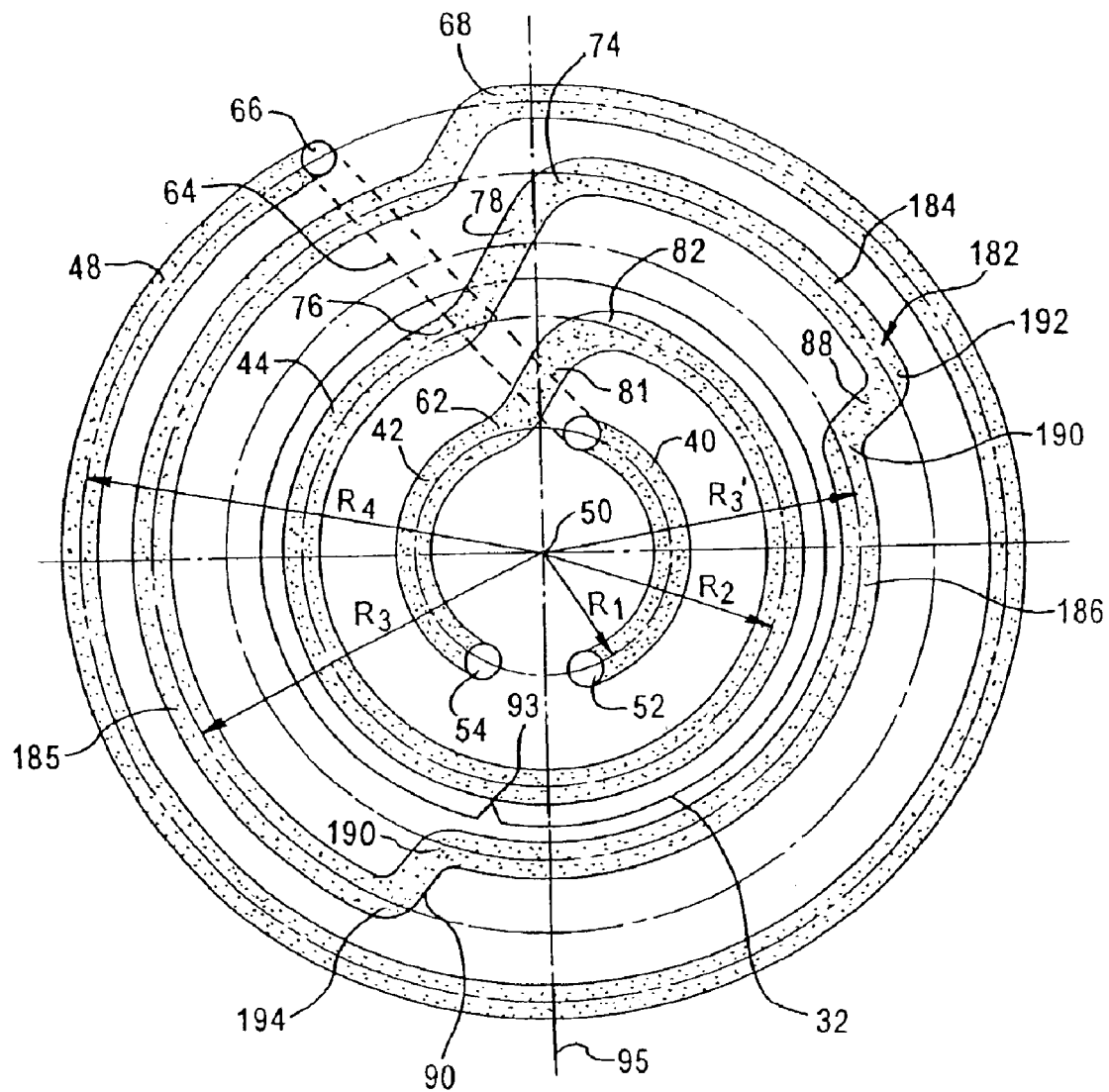
FIG. 5 is a top view of the coil schematically illustrated in FIG. 4.

The coil of FIGS. 4 and 5, which is used in the processor of FIG. 1 instead of the coil of FIG. 2, is configured very similarly to the coil of FIG. 2 in that the coil of FIGS. 4 and 5 has a 13 inch outer diameter and includes center point 50, substantially semicircular turn segments 40 and 42, almost circular turn 44, and almost circular turn 48. Each of segments 40, 42, 44 and 48 lies on a radius of center point 50, such that segments 40 and 42 are closest to the center point; turn 44 is at a radius that is greater than the radius of segments 40 and 42, and turn 48 is farther from center point 50 than any other part of the coil. Excitation terminals 52 and 54 are respectively at first ends of segments 40 and 42, while second ends 60 and 62 of segments 40 and 42 are connected to end points 66 and 81 or terminals of turns 48 and 44, respectively, by radially and circumferentially extending metal struts 64 and 82 preferably made of the same material as segments 40 and 42 and the turns of the coil; the material is typically copper.

The principal difference between the coils of FIGS. 2 and 4 is that the coil of FIG. 4 includes asymmetrical turn 182 including arcuate segments 184, 185 and 186. Segments 184 and 185 lie along the same radius from center point 50, while segment 186 lies on a radius closer to center point 50 than segments 184 and 185. In other words, segments 184 and 185 lie along an arc defined by a first radius from center point 50, while segment 186 lies along an arc defined by a second radius from center point 50, where the second radius is less than the first radius. In the preferred embodiment, outer edges of segments 184 and 185 are on a radius 5.5" (12.38 cm) from point 50, while the outer edge of segment 186 is on a radius 4.5" (11.25 cm) from point 50. The radii of segments 40 and 42 and of turns 44 and 48 are the same as those of the coil of FIG. 2. The outer edges of segments 40 and 42 are on radii 2" (5.08 cm) from center point 50, while the outer edges of turns 44 and 48 are respectively on radii 3.5" (8.75 cm) and 6.5" (16.25 cm) from center point 50. Segments 40, 42, 184, 185 and 186, as well as turns 44 and 48, are substantially coplanar so that the bottom faces thereof are either uniformly spaced from or abut the top face of dielectric window 19 of the processor of FIG. 1, such that the capacitive coupling from all segments of the coil of FIGS. 4 and 5 to regions within the processor immediately below the window is substantially the same.

Opposite ends 190 of segment 186 are respectively connected to ends 192 and 194 of segments 184 and 185 by radially and circumferentially extending metal struts 88 and 90. Segments 184, 185 and 186 respectively have arcuate extents of approximately 60°, 160° and 130°. The wafer being processed in the chamber of FIG. 1 is positioned relative to the coil of FIGS. 4 and 5 so that the wafer notch is offset about 10° in the clockwise direction from a vertical line intersecting center point 50 and equidistant from excitation terminals 52 and 54 at the ends of segments 42 and 44.

Metal strut 78 connects end 74 of segment 184 opposite from strut 88 to the end of outer turn 48 that is not connected to inner segment 40, while metal strut 72 connects the ends of turn 44 and segment 85 to each other.

Figure 6:
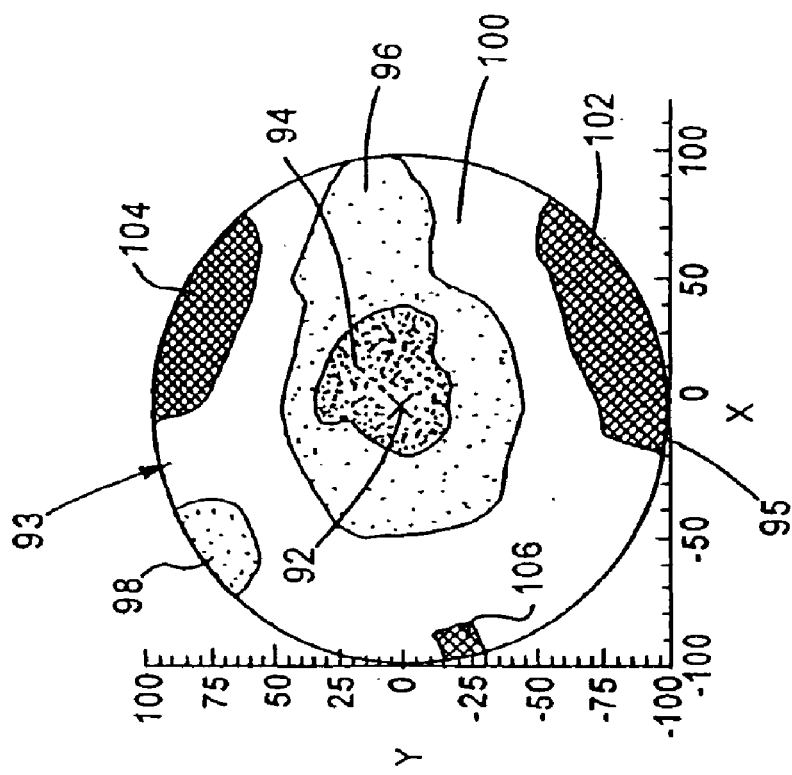
FIG. 6 is a top view of the etch rate of a wafer processed in the processor of FIG. 1 with the coil of FIGS. 4 and 5.

When the coil of FIGS. 4 and 5 is positioned above window 19 in the processor of FIG. 1, the etch rates of 200 mm wafer 93 mounted on electrostatic chuck 30 at the same position as wafer 71 are as shown by regions 94, 96, 98, 100, 102, 104 and 106 of FIG. 6. Wafer 93 was etched in the same chamber under the same conditions as wafer 71 of FIG. 3, except that the wafer 93 of FIG. 5 was responsive to plasma resulting from excitation by the coil of FIGS. 4 and 5, while the etch patterns of FIG. 3 resulted from r.f. excitation of the coil illustrated in FIG. 2. The same etchants were employed, and the wafers were positioned in the same place so that positioning notch 95 in the wafer of FIG. 5 was offset 10° clockwise from a line extending vertically in FIG. 6 from wafer center point 92, which was vertically aligned with coil center point 50.

The average etch rate of wafer 93, as illustrated in FIG. 6, was 2486 Angstroms per minute, with a non-uniformity of 0.8% at a standard deviation of one sigma. Region 94, which surrounds center point 92, has an etch rate of 2467 Angstroms per minute or less, while region 96, which surrounds region 94 and extends to the right of center point 92, has an etch rate in the range of 2467–2477 Angstroms per minute. Region 100, which surrounds region 96 and extends along a considerable portion of the periphery of wafer 93, over an arc length of approximately 180°, has an etch rate range between 2477 and 2487 Angstroms per minute. Region 98, which is in the upper left quadrant of the wafer and extends along the wafer periphery over an arc length of approximately 20°, has the same etch rate range as region 96. Regions 102, 104 and 106, having an etch rate in excess of 2487 Angstroms per minute, occupy small sectors along certain peripheral portions of wafer 93, such that region 102 extends about 70° generally along the lower right quadrant of the wafer edge, region 104 generally extends along about 60° of the wafer upper right quadrant, and region 106 extends about 10° along the edge of the wafer to the left of center point 92.

The coil of FIGS. 4 and 5 establishes plasma densities on wafer 93 by approximately the same mechanisms as previously in connection with the coil of FIG. 2 establishing plasma densities on wafer 71. The greater plasma density uniformity that etches wafer 93 relative to wafer 71 is established by adjusting the shape of the coil of FIGS. 4 and 5 based on the asymmetric regions 72–80 of FIG. 3.

Figure 3:
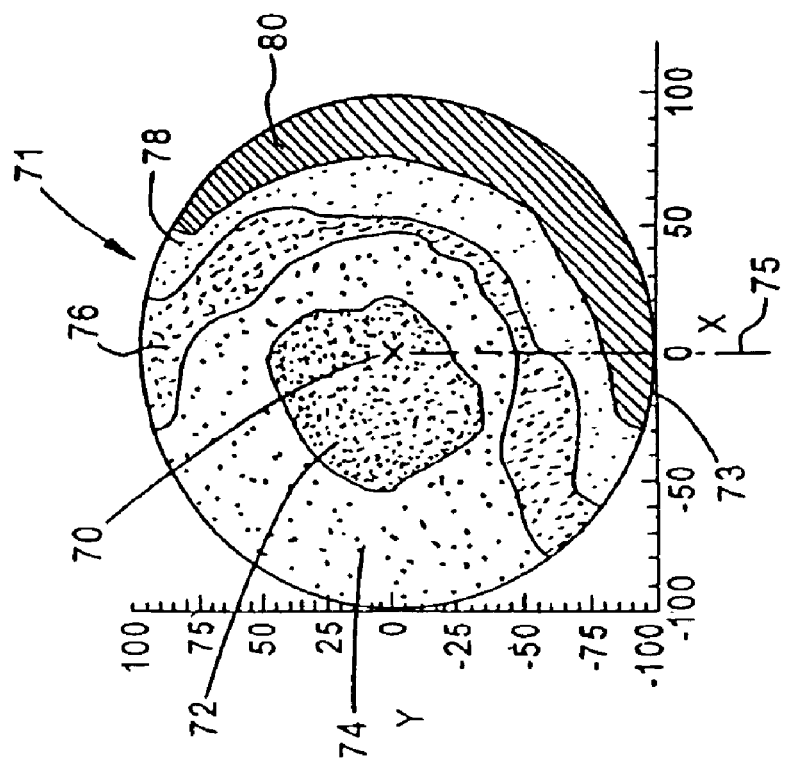
FIG. 3 is a top view of the etch rates of a wafer processed in the processor of FIG. 1 with the coil of FIG. 2.

A comparison of FIGS. 3 and 6 reveals that the etch rate asymmetry which existed in wafer 71 of FIG. 3 in regions 76, 78 and 80 is not present in the etch rate of wafer 93 of FIG. 6. The etch rate of the wafer of FIG. 6 is considerably more uniform than the etch rate of the wafer of FIG. 3 and does not include the skewed, i.e., asymmetrical, characteristics associated with regions 76, 78 and 80. Region 100 dominates the etch rate of FIG. 6 and extends over approximately 50% of the area of the wafer.

Figure 7:
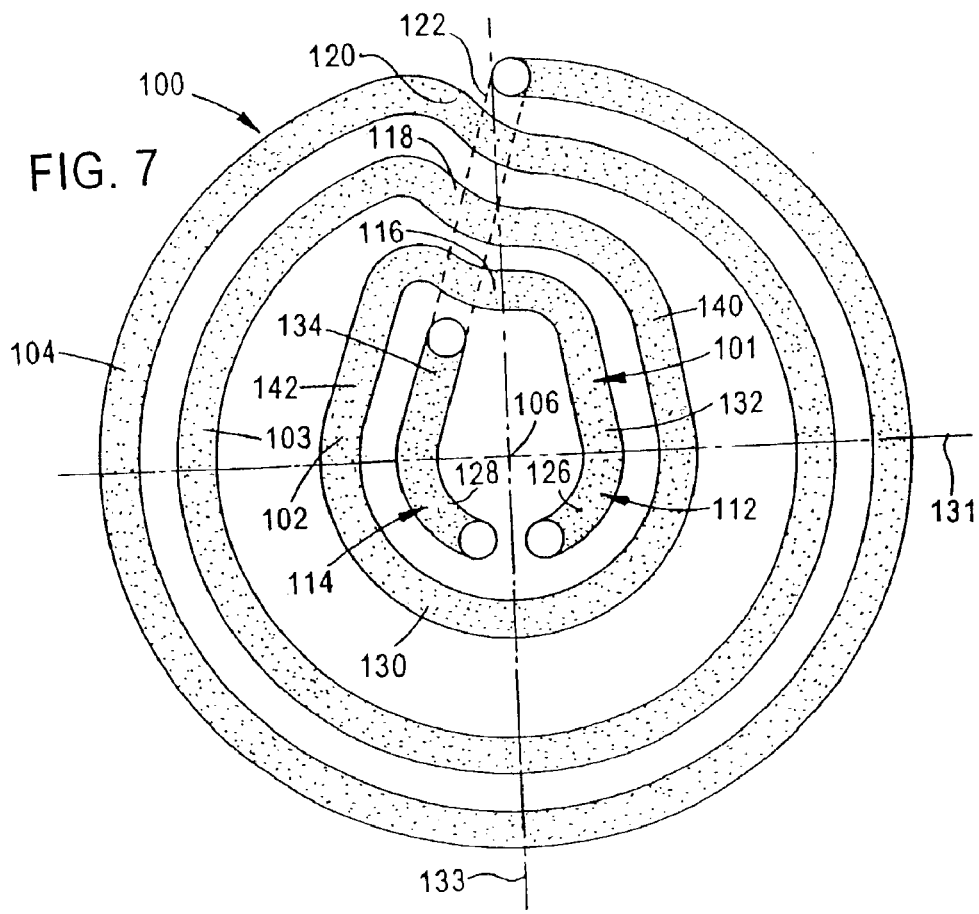
FIG. 7 is a top view of a coil for use in the processor of FIG. 1 when a 300 mm diameter wafer is being processed.

When the chamber of FIG. 1 is used to process 300 mm circular wafers, the coil of FIG. 5 is replaced by coil 100 of FIG. 7. Coil 100 of FIG. 7, like the coils of FIGS. 2 and 5, includes four turns 101–104, all of which are concentric with the coil center point 106. Interior, split turn 101 includes two separated segments 112 and 114, respectively including excitation terminals 108 and 110, respectively connected to the output terminal of matching network 28 and capacitor 80, FIG. 1. Radially and circumferentially extending struts 116, 118 and 120 connect adjacent pairs of turns 101–104 to each other so that strut 116 connects segment 112 of turn 101 to a first end of turn 102, strut 118 connects the second end of turn 102 to a first end of turn 103 and strut 120 connects a second end of turn 103 to a first end of turn 104. Strut 122 connects the second end of turn 104 to the end of portion 112 of turn 101 that is not connected to an output terminal of matching network 28.

Coil 100 of FIG. 7 differs from the coils of FIGS. 2, 4 and 5 because turns 101–104 of coil 100 have different geometries from the geometries of the turns of the coils illustrated in FIGS. 2, 4 and 5. In particular, turns 103 and 104 are both circular and respectively have outer edge radii of 8" (20.32 cm) and 6.5" (16.41 cm). Turns 101 and 102 of coil 100 differ from the two interior turns of the coils of FIGS. 2, 4 and 5 because turns 100 and 102 are asymmetrical with respect to center point 106. Coil portions 112 and 114 of turn 101 and turn 102 include portions 126, 128 and 130, that are segments of circles respectively having outer radii of 2" (5.08 cm), 2" (5.08 cm) and 3.75" (9.4 cm), relative to center point 106. Each of portions 126, 128 and 130 has an arc length of 180°, on the side of the coil 100 opposite from the side of the coil where struts 116, 118, 120 and 122 are located.

As illustrated in FIG. 7, coil 100 includes a horizontal diameter 131 and vertical diameter 133, at right angles to each other. Struts 116–120 intersect vertical diameter 133, while the ends of circular portions 126, 128 and 130 intersect horizontal diameter 131. Portions 112 and 114 of split turn 101 respectively include relatively straight segments 132 and 134 that extend upwardly from horizontal diameter 131 and somewhat inwardly toward vertical diameter 133. Straight segments 132 and 134 have a center line that is offset from vertical diameter 133 by approximately 10°. Segment 132 extends upwardly from horizontal axis 131 so that the tip of the end point of segment 132 is displaced from horizontal diameter 1311 by 2.25" (6 cm), while the straight portion of segment 134 thereof ends 3.25" (8.80 cm) above diameter 131.

Turn 102 includes straight segments 140 and 142 on the right and left sides of vertical diameter 133. Each of segments 140 and 142 tilts inwardly toward vertical diameter 133 by an angle of approximately 10°. Hence, segments 140 and 142 are respectively substantially parallel to segments 136 and 138. The straight portion of segment 142 ends at a point that is about 3.4" above horizontal diameter 131, while the straight portion of segment 142 ends at a point that is about 3.5" above horizontal diameter 131.

From the foregoing, coil 100 includes two symmetrical outer turns 103 and 104 and two asymmetrical inner turns 101 and 102. The asymmetrical relationship enables coil 100 to overcome the tendency for radial asymmetric flux distribution which the coil of FIG. 2 exhibits, while the larger diameters of turns 103 and 104 enable coil 100 to produce a plasma density that is substantially uniform across 300 mm circular wafers.

The other significant change that must be made in converting the chamber of FIG. 1 from a 200 mm wafer processor to a 300 mm wafer processor, in addition to the change of the coil from the coil of FIG. 5 to the coil of FIG. 7, is to change the size of the electrostatic chuck which forms a pedestal for the 200 mm and 300 mm workpieces. The 200 mm chuck is not suitable for 300 mm wafers because the electrostatic clamping force applied to the peripheral portions of the wafer with a chuck for 200 mm wafers is not sufficient to hold the 300 mm wafer in place.

An electrostatic chuck for a 300 mm wafer cannot be used with a 200 mm wafer because it is essential for the wafer to completely cover the chuck electrodes.

Figure 8:
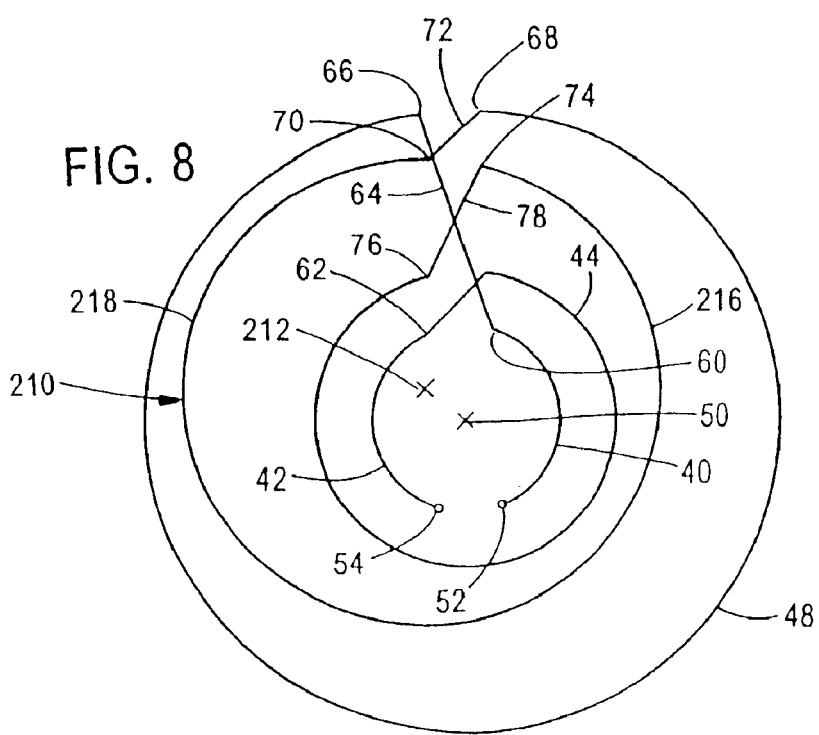
FIG. 8 is a top schematic view of a coil.

FIG. 8 is a schematic top view of a further embodiment of a coil including symmetrical and asymmetrical windings which can be used in a processor of the type shown in FIG. 1. The coil of FIG. 8 is similar in shape to the coil of FIGS. 4 and 5, except that turn 210 in the coil of FIG. 8 replaces turn 182 in the coil of FIGS. 4 and 5. Turn 210 of FIG. 8 is a substantially circular turn having a center point 212 shifted to the left and above center point 50. The radius of turn 210 is between the radii of turns 44 and 48 and is preferably about 5½". Hence, portion 216 on the right side of turn 210 is quite close to the right side of turn 44, but is quite far removed from the right side of turn 48. In contrast, portion 218 on the left side of turn 210 is quite close to the left side of turn 48 and is spaced significantly from the left upper portion of turn 44. The spacing between left side portion 218 of turn 210 and the left side of turn 48 must be sufficient to prevent airing.

While there have been described and illustrated plural specific embodiments of the invention, it will be clear that variations in the details of the embodiments specifically illustrated and described may be made without departing from the true spirit and scope of the invention as defined in the appended claims. For example, circular turn 110 of FIG. 8 could be replaced by an elliptical turn having a placement similar to the placement of turn 110 or by other turns having a closed (except for the break for connections to the adjacent turns) asymmetrical configuration arranged to reduce the plasma density non-uniformity of FIG. 3.

We claim:

1. A method of processing workpieces having differing first and second peripheral lengths and geometrically similar shapes, the workpieces being processed in the same vacuum plasma processing chamber or vacuum plasma processing chambers having the same geometries, the method comprising the steps of causing r.f. plasma excitation coils having first and second different peripheral dimensions to be coupled to ionizable gas in the chamber or chambers while the workpieces having the first and second peripheral lengths are being respectively processed in the chamber or chambers while the chamber or chambers are in vacuo and r.f. energy is supplied to the coils to excite the gas to a processing plasma, the first peripheral length exceeding the second peripheral length, the first peripheral dimension being greater than the second peripheral dimension.

2. A method according to claim 1 wherein the chamber or chambers include electrostatic chucks having first and second different sizes and are respectively used with the workpieces having the first and second peripheral lengths, the chucks having the first size being completely covered by the workpieces having the first peripheral lengths, the chucks having the second size being completely covered by the workpieces having the second peripheral lengths.

3. The method according to claim 1 wherein the workpieces having the first and second differing peripheral lengths are processed in the same chamber at first and second differing times, the coil having the first peripheral dimension being coupled to ionizable gas in the chamber during the first time, the coil having the second peripheral dimension being coupled to ionizable gas in the chamber during the second time.

4. The method according to claim 3 wherein the chamber includes a first electrostatic chuck during the first time and a second electrostatic chuck during the second time, the first and second chucks having differing sizes so that the first chuck is completely covered by the first workpiece and the second chuck is completely covered by the second workpiece.

5. The method according to claim 1 wherein the workpieces having the first and second differing peripheral lengths are processed in first and second chambers having the same geometries, the coil having the first peripheral dimension being coupled to ionizable gas in the first chamber, the coil having the second peripheral dimension being coupled to ionizable gas in the second chamber.

6. The method according to claim 5 wherein the first chamber includes a first electrostatic chuck and the second chamber includes a second electrostatic chuck, the first and second chucks having differing sizes so that first chuck is completely covered by the first workpiece and the second chuck is completely covered by the second workpiece.

7. The method of claim 1 wherein the workpieces are circular and each of the coils includes plural substantially circular coaxial turns having a center point aligned with center points of the circular workpieces being processed.

8. The method of claim 7 wherein one of the circular turns of each coil is a peripheral turn having an edge defining the coil peripheral dimension.

9. The method of claim 8 wherein each of the coils includes pair of internal excitation terminals connected to an r.f. excitation source during processing.

10. The method of claim 9 wherein each of the coils includes at least one turn that is asymmetric with respect to the coil point.

11. The method of claim 10 wherein the first and second workpieces respectively have 300 mm and 200 mm diameters, and the coils for the 300 mm and 200 mm diameters have an outer turn with an outer edge lying on the circumference of circles having outer diameters greater than 300 mm.

12. The method of claim 11 wherein the circle of the coil for the 300 mm diameter workpiece has a diameter of about 400 mm and the circle of the coil for the 200 mm workpiece has a diameter of about 330 mm.

13. The method of claim 12 wherein the number of turns for both the 300 mm and 200 mm workpieces is four.

14. The method of claim 13 wherein the coil for the 200 mm workpiece has a turn with the second next largest diameter that is asymmetrical.

15. The method of claim 13 wherein the coil for the 300 mm diameter workpiece includes an asymmetric turn that is closer to the coil center point than any other turn of the coil.

16. The method of claim 7 wherein each of the coils includes (a) plural coaxial turns substantially symmetrically arranged with respect to a center point of the coil, and (b) at least one further turn asymmetrically arranged with respect to the coil center point.

17. The method of claim 16 wherein the plural turns of each coil are series connected circular turns having differing diameters and centrally located excitation terminals.

18. The method of claim 16 wherein the at least one further turn of each coil includes arcuate portions having differing spacings from the coil center point.

19. The method of claim 18 wherein the at least one further turn of each coil has a shape that is closed except for connections to adjacent turns.

20. The method of claim 18 wherein the at least one further turn of each coil includes first and second of said arcuate portions, the first and second portions being sectors of circles having different radii and a common center point that is substantially the same as the center point of the plural turns.

21. The method of claim 20 wherein for each of the coils there are three of the plural turns, the at least one further turn being between the plural turns having the largest and second smallest radii, the excitation terminals being on the turn having the smallest radius, the turns having progressively greater separation from the center point being connected directly to each other, the turns having the largest and smallest radii being directly connected to each other.

22. The method of claim 16 wherein the at least one further turn of each coil includes a first portion that is a sector of a circle having a center that is coincident with the coil center point, a second portion that extends substantially straight from a first end of the first portion and a third portion that extends substantially straight from a second end of the first portion.

23. The method of claim 22 wherein the first portion of each coil is split into first and second segments respectively having third and fourth ends, the third and fourth ends being connected to the r.f. source.

24. The method of claim 23 wherein each of the coils includes first and second of said at least one further turn, the first of the said at least one further turn being closer to the coil center point than the second of said at least one further turn, both of said at least one further turn including a first portion that is a sector of a circle having a center that is coincident with the coil center point, a second portion that extends substantially straight from a first end of the first portion and a third portion that extends substantially straight from a second end of the first portion, the sectors of the circle of both of said at least one further turn being arcuately aligned, the straight portions of both of said at least one further turn extending substantially parallel to each other, the first and second of said at least one further turn being the turn of the coil closest to the coil center point.

* * * * *